United States Patent
Shin et al.

(10) Patent No.: US 8,592,828 B2
(45) Date of Patent: Nov. 26, 2013

(54) ORGANIC LIGHT EMITTING DEVICE AND METHOD FOR MANUFACTURING THE SAME

(75) Inventors: YoungHoon Shin, Paju-si (KR); ByungChul Ahn, Seoul (KR); Jaehyuk Lee, Paju-si (KR); YoonHeung Tak, Yongin-si (KR); Myungseop Kim, Goyang-si (KR); SeUng Kyoung, Gimje-si (KR)

(73) Assignee: LG Display Co., Ltd., Seoul (KR)

( * ) Notice: Subject to any disclaimer, the term of this patent is extended or adjusted under 35 U.S.C. 154(b) by 34 days.

(21) Appl. No.: 13/330,301

(22) Filed: Dec. 19, 2011

(65) Prior Publication Data

US 2012/0313137 A1    Dec. 13, 2012

(30) Foreign Application Priority Data

Jun. 8, 2011 (KR) .................. 10-2011-0055238

(51) Int. Cl.
*H01L 27/15* (2006.01)

(52) U.S. Cl.
USPC ............... 257/79; 257/40; 257/72; 257/98; 257/99; 438/29; 438/30; 438/149; 438/166

(58) Field of Classification Search
None
See application file for complete search history.

(56) References Cited

U.S. PATENT DOCUMENTS

| 6,798,133 B1 * | 9/2004 | Ambrugger et al. .......... 313/498 |
| 2006/0278965 A1 | 12/2006 | Foust et al. |
| 2011/0187629 A1 | 8/2011 | Nam et al. |
| 2011/0273077 A1 | 11/2011 | Chen et al. |

FOREIGN PATENT DOCUMENTS

JP    2006-128022 A    5/2006

OTHER PUBLICATIONS

English Machine Translation of JP 2006-128022.

* cited by examiner

*Primary Examiner* — Kyoung Lee
(74) *Attorney, Agent, or Firm* — Birch, Stewart, Kolasch & Birch, LLP

(57) ABSTRACT

An organic light emitting device and a method for manufacturing that same are discussed, which can reduce thickness and weight of the device as well as the manufacturing cost. The organic light emitting device includes according to an embodiment an organic light emitting diode (OLED) formed on a glass substrate; an adhesive layer formed to cover the OLED; and a metal foil formed on the adhesive layer to seal the OLED and bonded to the glass substrate, wherein the metal foil is formed of an alloy having the same or substantially the same thermal expansion coefficient as that of the glass substrate.

17 Claims, 7 Drawing Sheets

RELATED ART

ORGANIC LIGHT EMITTING DEVICE AND METHOD FOR MANUFACTURING THE SAME

CROSS REFERENCE TO RELATED APPLICATIONS

This application claims priority under 35 U.S.C. §119 to the benefit of the Korean Patent Application No. 10-2011-0055238, filed on Jun. 8, 2011, which is hereby incorporated by reference for all purposes as if fully set forth herein.

BACKGROUND OF THE INVENTION

1. Field of the Invention

Embodiments of the present invention relate to an organic light emitting device and a method for manufacturing the same, which can reduce the manufacturing cost as well as thickness and weight of the device.

2. Discussion of the Related Art

A liquid crystal display device has been widely used as a flat panel display device. However, the liquid crystal display device requires a back light as a separate light source and has also technical limitations in brightness, contrast ratio, and viewing angle.

Recently, an organic light emitting device, which does not require a separate light source due to its self light-emission and has relatively excellent brightness, contrast ratio and viewing angle, has received much attention.

This organic light emitting device may be divided into a passive matrix type organic light emitting device and an active matrix type light emitting device in accordance with a driving mode.

In the passive matrix type organic light emitting device, a thin film transistor (TFT) is not separately provided and pixels are arranged in a matrix arrangement. Also, since each pixel is driven by sequential driving of scanning lines, higher voltage and higher current should instantaneously be applied to the passive matrix type organic light emitting device as the scanning lines are increased. Accordingly, power consumption is increased and there is limitation in resolution.

On the other hand, in the active matrix type light emitting device, a TFT is formed at each of pixels arranged in a matrix arrangement. Also, each pixel is driven by switching driving of the TFT and voltage charging of a storage capacitor Cst.

The active matrix type light emitting device is advantageous in that it has lower power consumption and higher resolution than the passive matrix type light emitting device. Accordingly, the active matrix type light emitting device is suitable for a display device that requires high resolution and a large display area.

Hereinafter, an active matrix type organic light emitting device according to a related art will be described with reference to the accompanying drawings. In this specification, the active matrix type organic light-emitting device will briefly be referred to as an organic light emitting device.

Figure 1:
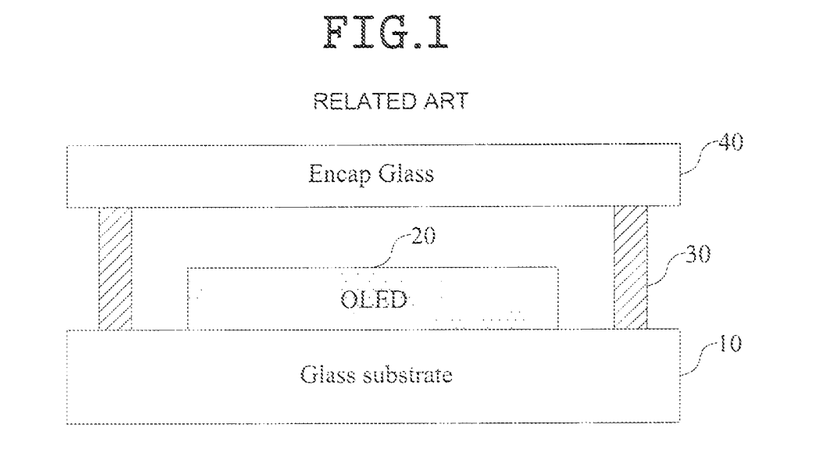
FIG. 1 is a cross-sectional view illustrating a frit sealing type organic light emitting device according to the related art.

FIG. 1 is a cross-sectional view illustrating a frit sealing type organic light emitting device according to the related art.

A light emitting region of an entire region of the organic light emitting device is only shown in FIG. 1. In FIG. 1, a TFT array region where a switching TFT and a driving TFT for driving an organic light emitting diode (OLED) 20 are formed is not shown.

Referring to FIG. 1, the organic light emitting device according to the related art includes a glass substrate 10, which is a base substrate, an OLED 20 emitting light depending on a current input by driving of the switching TFT and the driving TFT, a frit 30 protecting the OLED 20, and a sealing glass (or encap glass) 40 for sealing pixels.

In this case, the frit 30 includes a glass powder for protecting the OLED 20 from an external factor such as moisture.

The glass substrate 10 may be made of a transparent glass having a plate shape, and may be formed using a material such as potassium lime, soda lime or quartz.

Although not shown, the organic light emitting device according to the related art may further include a polarizing layer for polarizing light from the OLED 20, a cover glass arranged on a display panel, and an adhesive layer for attaching the cover glass to the display panel.

Figure 2:
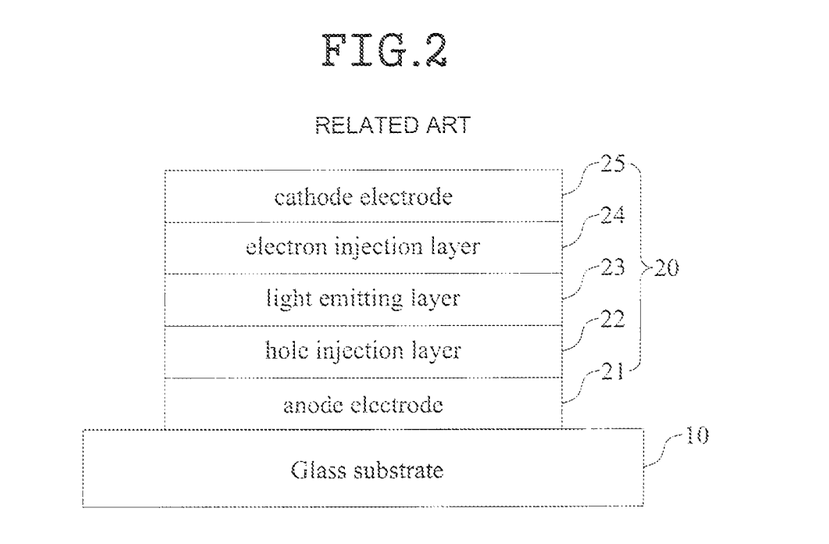
FIG. 2 is a brief diagram illustrating a light emitting structure of an organic light emitting device according to the related art.

FIG. 2 is a brief diagram illustrating a light emitting structure of the OLED according to the related art.

Referring to FIG. 2, the OLED 20 is a transparent electrode on the glass substrate 10, and is provided with an anode electrode 21 used as a positive electrode.

A hole injection layer 22, a light emitting layer 23 and an electron injection layer 24 are sequentially deposited on the anode electrode 21. A cathode electrode 25 used as a negative electrode is formed on the electron injection layer 24.

If electrons generated by the cathode electrode 25 and holes generated by the anode electrode 21 are injected into the light emitting layer 23, the electrons and holes are combined with one another to generate excitons. When the generated excitons are shifted from an exited state to a ground state, light is emitted, whereby picture images are displayed.

Figure 3:
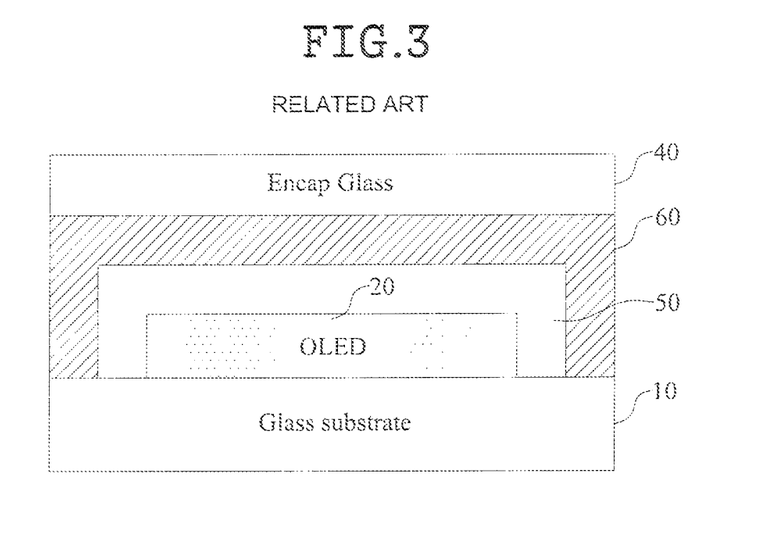
FIG. 3 is a cross-sectional view illustrating a front sealing type organic light emitting device according to the related art.

FIG. 3 is a cross-sectional view illustrating a front sealing type organic light emitting device according to the related art.

Referring to FIG. 3, the front sealing type organic light emitting device according to the related art includes a glass substrate 10, which is a base substrate, an OLED 20 emitting light depending on a current input by driving of a switching TFT and a driving TFT, a passivation layer 50 formed to cover the OLED 20, an adhesive layer 60 formed to cover the passivation layer 50, and a sealing glass (or encap glass) 40 formed on the adhesive layer 60 to seal the OLED 20.

The passivation layer 50 is to protect the OLED 20 from an external factor such as moisture, and is formed to cover the OLED 20. The adhesive layer 60 is formed on the passivation layer 50, and the sealing glass 40 is formed on the adhesive layer 60.

The sealing type organic light emitting device according to the related art planarizes the glass substrate 10 through the adhesive layer 60. The sealing glass 40 is attached onto the adhesive layer 60 to seal the OLED 20 from the external factor such as moisture.

The organic light emitting device according to the related art, which has the aforementioned structures of FIG. 1 and FIG. 3, is manufactured by sequentially performing the steps of forming a TFT in an array region, manufacturing the OLED by depositing an organic material, and sealing the light emitting region.

However, the OLED 20 of the related art, which should be sealed from the outside due to its vulnerability to moisture, has problems as follows.

Since the frit sealing type organic light emitting device according to the related art shown in FIG. 1 seals the OLED 20 from the external factor such as moisture by using the glass powder, the frit 30 and the sealing glass 40 are used.

Also, the front sealing type organic light emitting device according to the related art shown in FIG. 3 seals the OLED 20 from the external factor such as moisture by forming the passivation layer 50 and the adhesive layer 60 on the OLED 20 and forming the sealing glass 40.

In this case, as the sealing glass 40 is formed on the OLED 20, a problem occurs in that the thickness is increased. A problem also occurs in that the manufacturing cost is increased as the sealing glass 40 is used.

SUMMARY OF THE INVENTION

Accordingly, embodiments of the present invention are directed to an organic light emitting device and a method for manufacturing the same that substantially obviates one or more problems due to limitations and disadvantages of the related art.

An advantage of the embodiments of the present invention is to provide an organic light emitting device and a method for manufacturing the same, which can reduce thickness and weight of the device by sealing an OLED with a metal foil.

Another advantage of the embodiments of the present invention is to provide an organic light emitting device and a method for manufacturing the same, which can reduce the manufacturing cost by sealing an OLED with a metal foil.

Still another advantage of the embodiments of the present invention is to provide an organic light emitting device and a method for manufacturing the same, which can increase light efficiency and improve display quality by replacing a sealing glass of the related art with a metal foil.

Further still another advantage of the embodiments of the present invention is to provide an organic light emitting device and a method for manufacturing the same, which can prevent an OLED panel from being bent due to the heat during a manufacturing process when an OLED is sealed with a metal foil having a thermal expansion coefficient the same or substantially the same as that of a glass substrate.

Additional advantages and features of the embodiments of the invention will be set forth in part in the description which follows and in part will become apparent to those having ordinary skill in the art upon examination of the following or may be learned from practice of the invention. The objectives and other advantages of the embodiments of the invention may be realized and attained by the structure particularly pointed out in the written description and claims hereof as well as the appended drawings.

To achieve these objects and other advantages and in accordance with the purpose of the invention, as embodied and broadly described herein, an organic light emitting device includes an organic light emitting diode (OLED) formed on a glass substrate; an adhesive layer formed to cover the OLED; and a metal foil formed on the adhesive layer to seal the OLED and bonded to the glass substrate, wherein the metal foil is formed of a metal material, e.g., alloy such as a Fe—Ni alloy or KOVAR (Fe—Ni—Co alloy).

In another aspect of the present invention, a method for manufacturing an organic light emitting device includes the steps of forming an organic light emitting diode (OLED) and a plurality of lines and driving devices for driving the OLED on a glass substrate; depositing a thermal hardening resin or a thermal hardening sealing material on the glass substrate to cover the OLED; and forming an adhesive layer by aligning a metal foil on the glass substrate and performing a thermal hardening process at a temperature of 80° C.~420° C. and sealing the OLED by bonding the glass substrate to the metal foil, wherein the metal foil is formed of a metal material, e.g., alloy such as a Fe—Ni alloy or KOVAR (Fe—Ni—Co alloy).

It is to be understood that both the foregoing general descriptions and the following detailed descriptions of the embodiments of the present invention are exemplary and explanatory and are intended to provide further explanation of the embodiments of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, an organic light emitting device and a method for manufacturing the same according to the embodiments of the present invention will be described with reference to the accompanying drawings.

In the description of the embodiments according to the present invention, the disclosure that a structure is formed 'on or above' and 'below or under' another structure should be interpreted to include the disclosure that a third structure is interposed between the structures as well as the disclosure that the structures are in contact with each other. The term "substantially the same" is interpreted to include that the metal foil has the thermal expansion coefficient substantially equal or similar to that of the glass substrate.

Although not shown, the organic light emitting device according to the embodiment of the present invention may include a gate line, an EM (emitting) line, a data line, a driving power line, a reference power line, a capacitor Cst, a plurality of switching TFTs and a plurality of driving TFTs.

Figure 4:
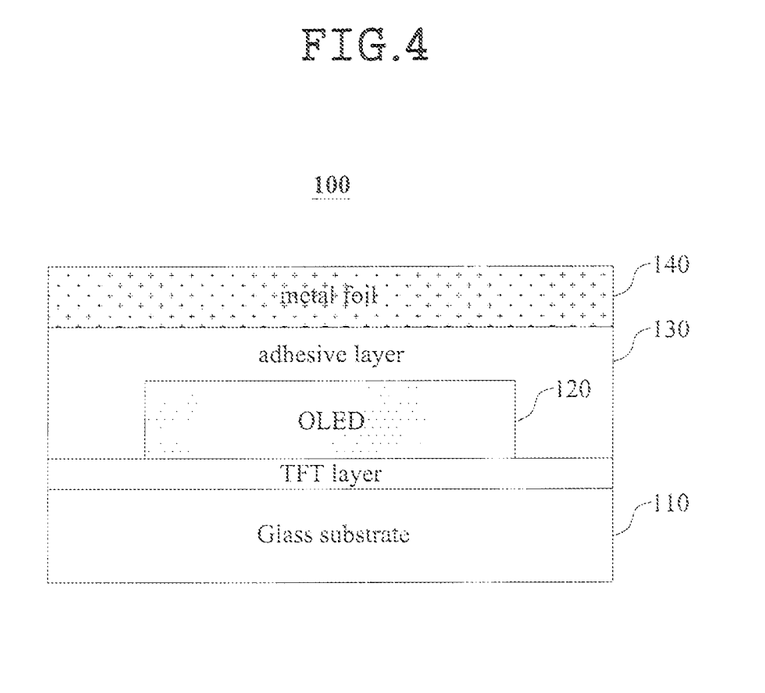
FIG. 4 is a cross-sectional view illustrating an organic light emitting device according to an embodiment of the present invention.

FIG. 4 is a cross-sectional view illustrating an organic light emitting device according to the embodiment of the present invention.

A light emitting region of an entire region of an organic light emitting device 100 is shown in FIG. 4. An array region in which a switching TFT and a driving TFT for driving an organic light emitting diode (OLED) 120 are formed is not shown in FIG. 4.

Referring to FIG. 4, the organic light emitting device 100 according to the embodiment of the present invention includes a glass substrate 110, an OLED 120, an adhesive layer 130, and a metal foil 140.

The glass substrate 110 may be made of a transparent glass having a plate shape, and may be formed using a material such as potassium lime, soda lime or quartz. Meanwhile, a flexible substrate of a transparent material may also be used as the glass substrate 110.

A TFT array that includes a plurality of switching TFTs and driving TFTs for driving the OLED 120 is formed on the glass substrate 110. This layer is shown as a "TFT layer" in FIG. 4. Also, the organic light emitting device according to the embodiment of the present invention may further include other known components of a general organic light emitting device such as a gate line, an EM (emitting) line, a data line, a driving power line, a reference power line, and a capacitor.

The OLED 120 has a structure in which an anode electrode, a hole injection layer, a light emitting layer, an electron injection layer and a cathode electrode are sequentially formed such as in FIG. 2, wherein the anode electrode is a transparent electrode and is used as a positive electrode.

The OLED 120 is formed at a plurality of pixels of a display region of the light emitting device 100, and displays a picture image by emitting light through a driving current applied through a driving TFT of the light emitting device 100. At this time, the driving current applied to the OLED 120 is generated to correspond to image data to display a picture image.

The adhesive layer 130 protects the OLDE 120 from an external factor such as moisture. Also, the adhesive layer 130 functions to attach the metal foil 140 thereon, which seals the OLED 120, and is formed to cover the OLED 120.

The adhesive layer 130 may be formed of an adhesive film or an optical cleared adhesive (OCA) which is a transparent adhesive material having excellent light transmittance. The adhesive layer 130 planarizes the glass substrate 110 and protects the OLED 120.

The metal foil 140 having a thickness of preferably about 50 μm to 500 μm is attached onto the adhesive layer 130 to seal the OLED 120.

The organic light emitting device according to the embodiment of the present invention is manufactured by sequentially performing the steps of forming a TFT array on a glass substrate, manufacturing the OLED 120 by depositing an organic material on the glass substrate, and sealing a light emitting region, i.e., the OLED 120.

When the OLED 120 is sealed with just any metal material as the metal foil 140 according to the embodiment of the present invention, instead of the sealing glass applied to the related art, a thermal expansion coefficient of the glass substrate is different from that of the sealing metal, whereby a problem such as bending of the OLED panel may occur.

In more detail, after the metal foil 140 is aligned on the adhesive layer 130, the glass substrate 110 and the metal foil 140 are bonded to each other by curing in a chamber at a certain temperature for several minutes to several hours. As a result, the OLED 120 is sealed.

At this time, the adhesive layer 130 is made of a resin having an adhesive material to bond the metal foil 140, which is the sealing material, to the glass substrate 110.

In this case, the adhesive layer 130 may be formed by irradiating UV to a resin having UV hardening characteristics. Since the metal foil 140 is a metal material, it fails to transmit UV.

Accordingly, when the OLED 120 is sealed with a metal material such as the metal foil 140, UV hardening resin is not used as the adhesive layer.

Since the resin is not hardened using UV when the OLED 120 is sealed with a metal film such as the metal foil 140, the adhesive layer 130 should be made of a thermal hardening resin.

At this time, the adhesive layer 130 is formed by performing a thermal hardening process at a temperature of 80° C. to 120° C. in view of characteristics of the thermal hardening resin. Afterwards, the glass substrate 110 and the metal foil 140 are bonded to each other using the adhesive layer 130.

When the thermal hardening process is performed for bonding of the glass substrate 110 and the metal foil 140, thermal expansion coefficients of the glass substrate 110 and the metal foil 140 which is a metal film should be considered.

The thermal expansion coefficient of the glass substrate 110 used to manufacture the organic light emitting device is about $2.5*10^{-6}/°$ C. (2.5 ppm/° C.)~about $5.5*10^{-6}/°$ C. (5.5 ppm/° C.). Meanwhile, it is general that the metal film formed of a metal material has a thermal expansion coefficient different from that of the glass substrate 110.

In this case, when heat is applied to the glass substrate 110 having a thermal expansion coefficient different from that of the metal film being used as the metal foil 140, so as to bond them to each other, the glass substrate 110 is expanded differently from the metal film during a thermal hardening process.

When the glass substrate 110 and the metal film are cooled after they are bonded to each other as the thermal hardening process is completed, the portion expanded during the thermal hardening process is contracted, whereby bending phenomena may occur in the OLED panel. This is because that expansion and contraction levels of the glass substrate 110 are different from those of the metal film due to the different thermal expansion coefficients.

Figure 5:
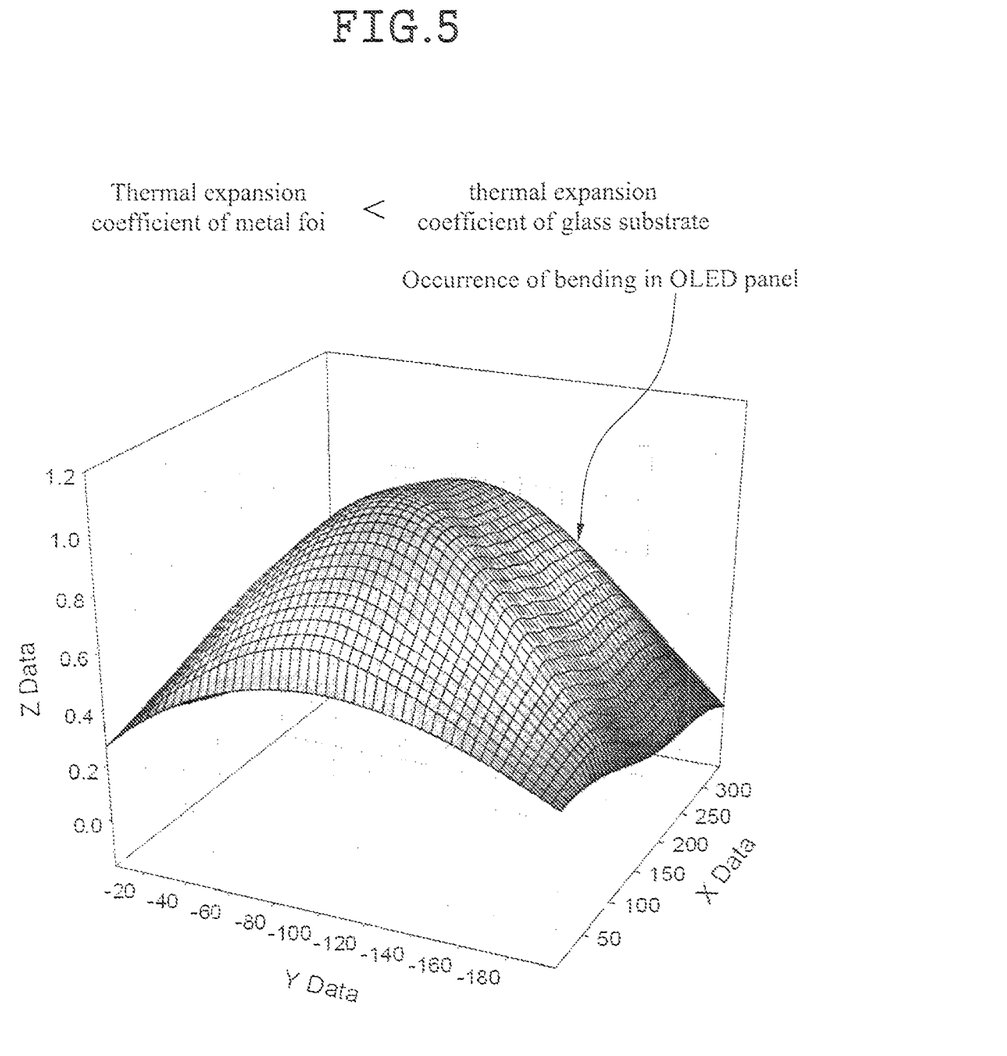
FIG. 5 and FIG. 6 are diagrams illustrating examples of bending of an OLED panel, which is generated by a difference in thermal expansion coefficients between a metal foil and a glass substrate.
Figure 6:
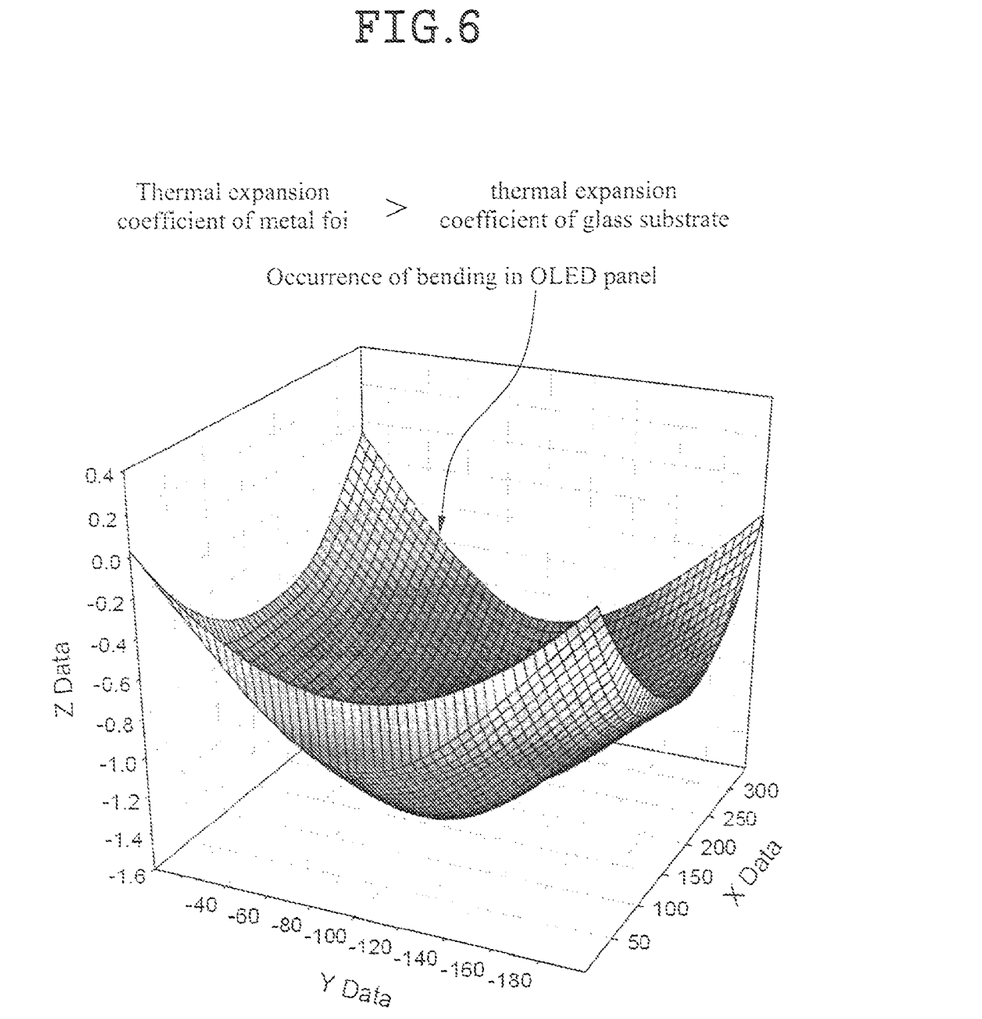

FIG. 5 and FIG. 6 are diagrams illustrating bending of an OLED panel, which is generated by a difference in thermal expansion coefficients between a metal foil and a glass substrate.

Referring to FIG. 5, if the thermal expansion coefficient of the metal foil 140 is smaller than that of the glass substrate 110, the OLED panel is bent upwardly to show a convex shape in Z axis direction.

Referring to FIG. 6, if the thermal expansion coefficient of the metal foil 140 is larger than that of the glass substrate 110, the OLED panel is bent downwardly to show a concave shape in Z axis direction.

In these manners, when the thermal hardening process for sealing the OLED 120 is performed, bending can occur in the OLED panel due to the difference in the thermal expansion coefficients between the metal film and the glass substrate 110 while the metal film and the glass substrate 110 are being cooled after being hardened.

If bending occurs in the OLED panel, that modularization may not be performed, a defect of the TFT array may occur, and the OLED 120 may not be sealed desirably. Since these problems can cause distortion of image, a fatal defect can occur in the organic light emitting device.

Thus, in the organic light emitting device according to the embodiment of the present invention, the metal foil 140 having a certain thermal expansion coefficient is used to prevent the OLED panel from being bent due to the difference in the thermal expansion coefficients between the metal film and the glass substrate 110.

For instance, an alloy of Fe and Ni, having a low thermal expansion coefficient, is used as the metal foil 140.

In one embodiment of the present invention, the metal foil 140 is formed of an alloy having the same or substantially the same or similar thermal expansion coefficient as or to that of the glass substrate 110, whereby the metal foil 140 may be used as a sealing material of the organic light emitting device.

Examples of the metal having a low thermal expansion coefficient, to be used as the metal foil 140, include INVAR (Fe-36Ni) in which Ni is contained in Fe, Fe-42Ni alloy, and KOVAR (Fe—Ni—Co).

For example, if the metal foil 140 is formed of an INVAR (Fe-36Ni) alloy having a composition ratio of about 64% of Fe and about 36% of Ni, the thermal expansion coefficient of the metal foil 140 may be controlled.

For another example, if the metal foil 140 is formed of a Fe-42Ni alloy having a composition ratio of about 58% of Fe and about 42% of Fe, the thermal expansion coefficient of the metal foil 140 may be controlled.

For another example, if the metal foil 140 is formed of a KOVAR (Fe—Ni—Co) alloy partially containing Co in addition to Fe and Ni, the thermal expansion coefficient of the metal foil 140 may be controlled.

The INVAR has a thermal expansion coefficient of about 0.7 [ppm/° C.] at a temperature range of 20° C.~100° C.

The KOVAR Fe-33Ni-4.5Co partially containing Co has a thermal expansion coefficient of about 0.55 [ppm/° C.] at a temperature range of 20° C.~100° C.

An alloy of which the content of Ni added to Fe is 42% (42Ni Alloy) has a thermal expansion coefficient of about 5.3 [ppm/° C.] at a temperature range of 20° C.~100° C.

The thermal expansion coefficient of about 5.3 ppm/° C. is the same as that of silicon (Si). Accordingly, the Fe-42Ni alloy may be used as a material that substitutes for Pb in most of electronic components that include an integrated circuit.

Figure 7:
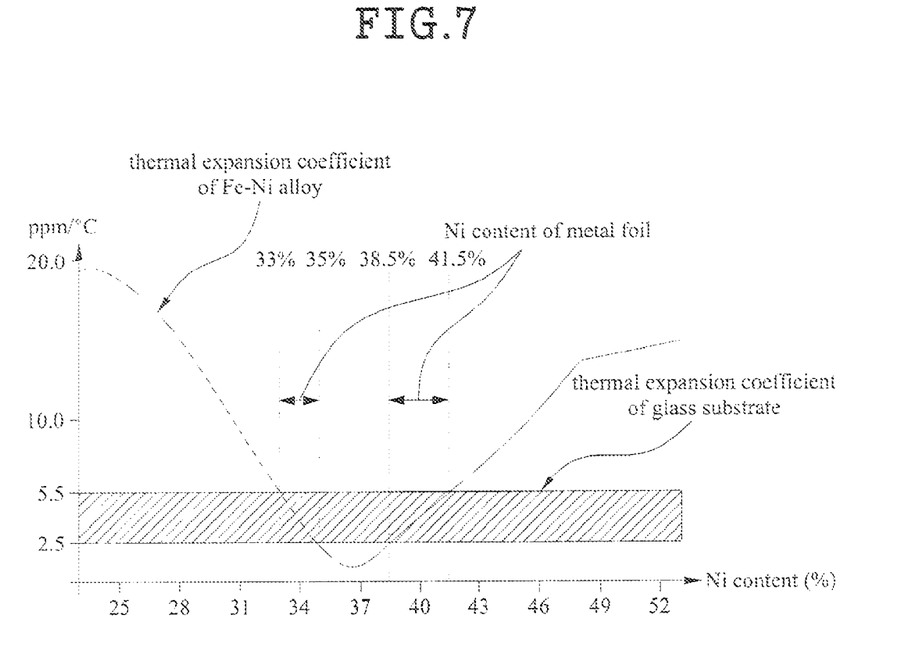
FIG. 7 is a diagram illustrating a thermal expansion coefficient of a metal foil and a composition ratio of the metal foil in an organic light emitting device according to an embodiment of the present invention.

FIG. 7 is a diagram illustrating a thermal expansion coefficient of a metal foil and a composition ratio of the metal foil in an organic light emitting device according to the embodiment of the present invention.

Referring to FIG. 7, the thermal expansion coefficient of the metal foil 140 may be presented equally or similarly to that of the glass substrate 110 by controlling a composition ratio of Fe and Ni.

The thermal expansion coefficient of the glass substrate 110 is about 2.5 [ppm/° C.]~about 5.5 [ppm/° C.]. Accordingly, if the metal foil 140 has a thermal expansion coefficient of about 2.5 [ppm/° C.]~about 5.5 [ppm/° C.], bending may be prevented from occurring in the OLED panel due to the thermal hardening process.

Thus, in an example of the present invention, the metal foil 140 having a thickness of about 50 μm to 50 μm is preferably formed of an alloy in which the content of Ni added to Fe has a composition ratio of about 33%~about 35% or about 38.5%~about 41.5%. In this way, if the metal foil 140 is formed of an alloy in which a content of Ni added to Fe is about 33%~about 35% or about 38.5%~about 41.5%, the metal foil 140 has a thermal expansion coefficient of about 2.5 [ppm/° C.]~about 5.5 [ppm/° C.] equally or similarly to that of the glass substrate 110, and the OLED bending problem can be avoided.

It is noted that if more than 35% of Ni is added to Fe, the thermal expansion coefficient of the Fe—Ni alloy is rapidly lowered, whereby a thermal expansion coefficient less than about 2.5 [ppm/° C.] is obtained. It is noted that if a content of Ni exceeds about 36%, the thermal expansion coefficient of the Fe—Ni alloy is again increased, and if the content of Ni is from about 38.5% to about 41.5%, a thermal expansion coefficient of about 2.5 [ppm/° C.]~about 5.5 [ppm/° C.] is obtained.

Also, it is noted that if the content of Ni exceeds about 41.5%, the thermal expansion coefficient is increased, whereby the thermal expansion coefficient of the metal foil exceeds about 5.5 [ppm/° C.].

Meanwhile, if the content of Ni is about 35%~about 38.5%, the thermal expansion coefficient is lowered to a value less than about 2.5 [ppm/° C.], whereby the thermal expansion coefficient of the metal foil is beyond the range of about 2.5 [ppm/° C.]~about 5.5 [ppm/° C.] corresponding to the thermal expansion coefficient of the glass substrate 110.

Accordingly, in the embodiments of the present invention, in order that the metal foil 140 has a thermal expansion coefficient the same as or similar to that of the glass substrate 110, the content of Ni added to Fe has a composition ratio of about 33%~about 35% or about 38.5%~about 41.5% to form the appropriate metal foil 140. In this case, the metal foil 140 has the thermal expansion coefficient of about 2.5 [ppm/° C.]~about 5.5 [ppm/° C.].

In the embodiments of the present invention, in order to prevent or minimize the OLED panel from being bent when the metal foil is replaced with non-alkali glass which is a sealing material of the front sealing type organic light emitting display, a composition ratio of an alloy of Ni added to Fe has been designed in the range of about 33%~about 35% or about 38.5%~about 41.5%, which is used as the metal foil 140.

In this way, the thermal expansion coefficient of the glass substrate 110 may be matched with that of the metal foil 140 to prevent or minimize the OLED panel from being bent due to the thermal hardening process for sealing the OLED 120.

Further, the organic light emitting device according to the embodiments of the present invention may reduce its thickness and weight as well as the manufacturing cost by replacing the expensive sealing glass with the cheaper metal foil 140.

Also, since the metal foil 140 is made of a metal material that reflects light, it may increase light efficiency of the organic light emitting device by reflecting the light generated by the OLED 120 in a direction of the glass substrate 110.

Although not shown, after an adhesive material is deposited on a rear surface of the glass substrate 110, a cover glass may be attached to a front surface of the glass substrate 110. A reinforcing glass may be used as the cover glass to protect the display panel from scratch, pressure and high temperature as well as external physical impact.

FIGS. 8 to 12 are diagrams illustrating a method for manufacturing an organic light emitting device such as the device 100 of FIG. 4 according to the embodiment of the present invention. Hereinafter, a method for manufacturing the organic light emitting device according to the embodiment of the present invention will be described with reference to FIGS. 8 to 12.

Figure 8:
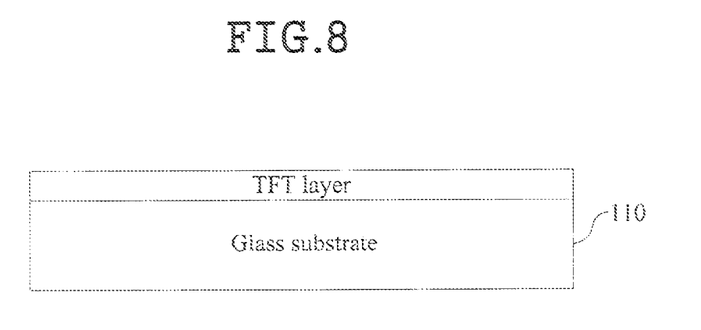
FIGS. 8 to 12 are diagrams illustrating a method for manufacturing an organic light emitting device according to an embodiment of the present invention.

As shown in FIG. 8, a TFT array, which includes a plurality of switching TFTs and driving TFTs, is formed on a glass substrate 110.

Figure 9:
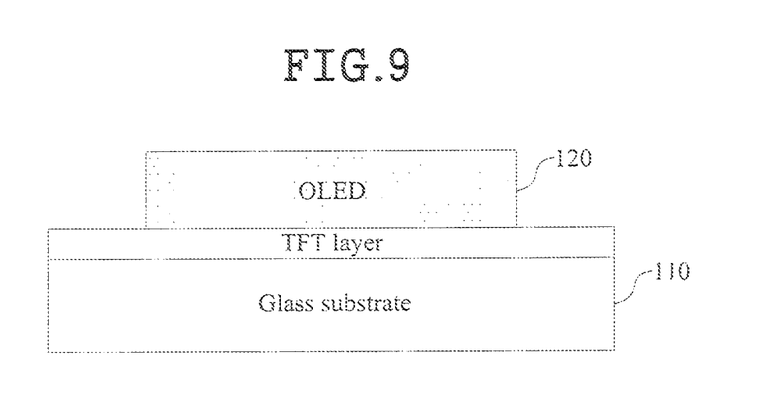

Subsequently, as shown in FIG. 9, an OLED 120 having a light emitting region is formed on the glass substrate 110.

Although not shown, a gate line, an EM line, a data line, a driving power line, a reference line and a capacitor Cst are formed in the array region when the OLED 120 is formed. Other components may also be formed as part of the device 100.

Figure 10:
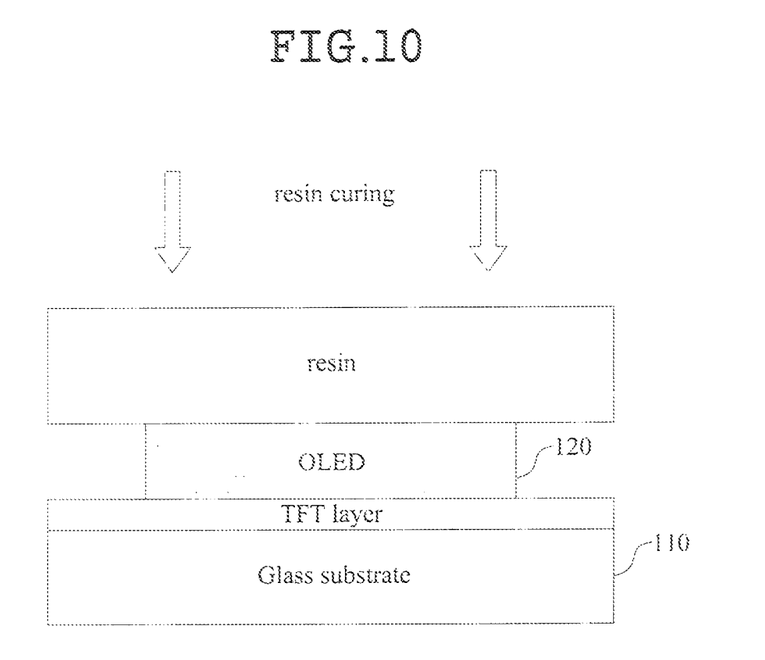

As shown in FIG. 10, a thermal hardening resin or a thermal hardening sealing material is deposited on the glass substrate 110 to cover the OLED 120.

Figure 11:
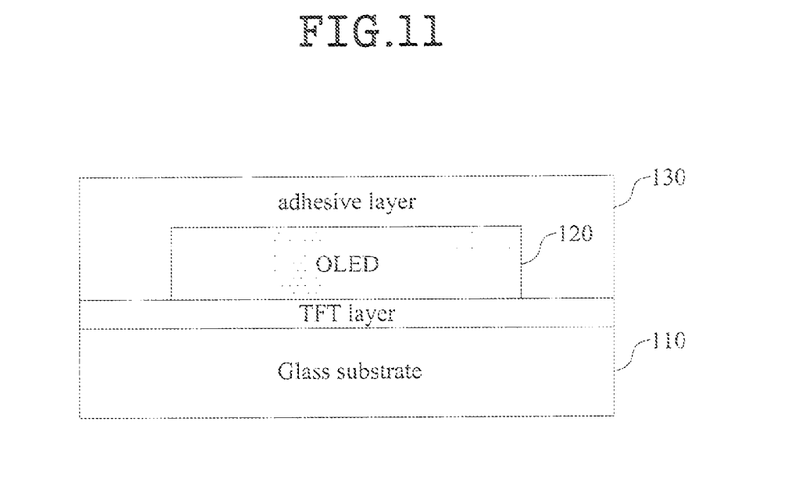

Subsequently, as shown in FIG. 11, the glass substrate 110 deposited with the thermal hardening resin or the thermal hardening sealing material is loaded into a chamber, and the resin is cured for several minutes or several hours at a temperature of 80° C.~120° C. to form an adhesive layer 130.

The adhesive layer 130 may be formed of an adhesive film or optical cleared adhesive (OCA), which is a transparent adhesive material having excellent light transmittance. The adhesive layer 130 planarizes the glass substrate 110 and protects the OLED 120.

Figure 12:
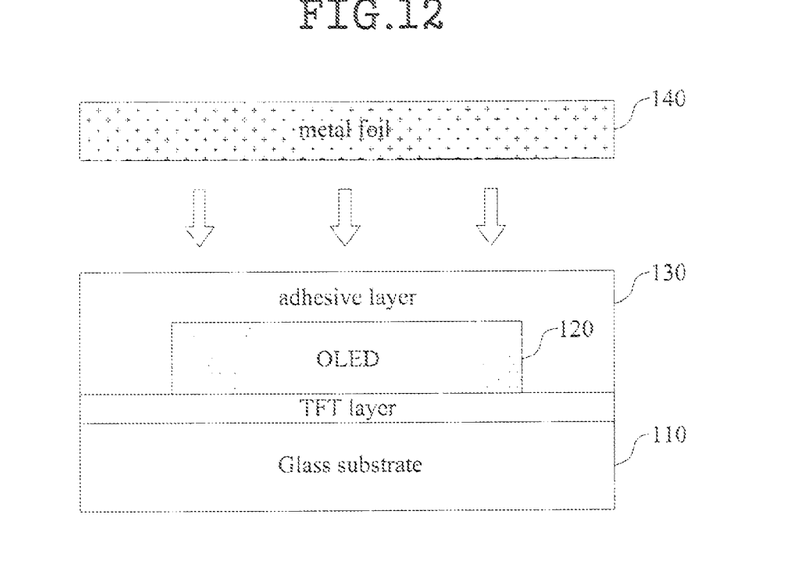

As shown in FIG. 12, the metal foil 140 is aligned on the adhesive layer 130, so that the glass substrate 110 and the metal foil 140 are bonded to each other by a thermal hardening process of a thermal hardening resin or a thermal hardening sealing material. In this case, the metal foil 140 is formed of an alloy of Fe and Ni to have a thickness of about 50 μm to about 500 μm.

The OLED 120 is sealed by bonding of the metal foil 140 so that the OLED 120 is protected from an external factor such as moisture. Also, since the adhesive layer 130 is formed of a resin or sealing material, the OLED 120 is doubly sealed by the adhesive layer 130 and the metal foil 140.

A method for manufacturing the organic light emitting device according to the embodiments of the present invention has considered the thermal expansion coefficients of the glass substrate 110 and the metal foil 140 in sealing the OLED 120 by bonding the metal foil 140 to the front surface of the glass substrate 110.

The thermal expansion coefficient of the glass substrate 110 used to manufacture the organic light emitting device is preferably about 2.5 [ppm/° C.]~about 5.5 [ppm/° C.]. If the thermal expansion coefficient of the metal foil 140 is different from that of the glass substrate 110, the thermal hardening process for forming and bonding the adhesive layer 130 is performed to prevent or minimize the OLED panel from being bent.

In the embodiments of the present invention, a composition ratio of Fe and Ni which are main composition materials of the metal foil 140, is controlled so that the thermal expansion coefficient of the metal foil 140 may be formed equally or similarly to that of the glass substrate 110. For instance, if the metal foil 140 has a thermal expansion coefficient of about 2.5 [ppm/° C.]~about 5.5 [ppm/° C.], the OLED panel may be prevented from being bent due to the thermal hardening process. As a result, an effective OLED panel is produced.

In the method for manufacturing the organic light emitting device according to the embodiments of the present invention, the metal foil 140 having a thickness of about 50 μm to about 500 μm is formed of an alloy in which a content of Ni added to Fe is about 33%~about 35% or about 38.5%~about 41.5%. In this way, if the metal foil 140 is formed of an alloy in which a content of Ni added to Fe has a composition ratio of about 33%~about 35% or about 38.5%~about 41.5%, it has a thermal expansion coefficient of about 2.5 [ppm/° C.]~about 5.5 [ppm/° C.] equally or similarly to that of the glass substrate 110.

In the embodiments of the present invention, in order to prevent the OLED panel from being bent when the metal foil is replaced with non-alkali glass which is a sealing material of the front sealing type organic light emitting display, a composition ratio of Ni added to Fe as the metal foil 140's material has been designed in the range of about 33%~about 35% or about 38.5%~about 41.5%.

In the method for manufacturing the organic light emitting device according to the embodiments of the present invention, which includes the aforementioned process and any other variations thereof, the thermal expansion coefficient of the glass substrate 110 may be matched with that of the metal foil 140 to prevent the OLED panel from being bent due to the thermal hardening process for sealing the OLED 120.

Also, the method for manufacturing the organic light emitting device according to the embodiments of the present invention may reduce the thickness and weight of the light emitting device by replacing the sealing glass of the related art with the metal foil 140 of the present invention.

Further, the organic light emitting device according to the embodiments of the present invention may reduce the manufacturing cost by replacing the expensive sealing glass with the cheaper metal foil 140.

Also, since the metal foil 140 is formed of a metal material that reflects light, it may increase light efficiency of the organic light emitting device by reflecting the light generated by the OLED 120 in a direction of the glass substrate 110.

As described above, the organic light emitting device and the method for manufacturing the same according to the present invention have at least the following advantages.

The embodiments of the present invention can reduce the thickness of the light emitting device by sealing the OLED with the metal foil.

Also, the embodiments of the present invention can reduce the manufacturing cost of the light emitting device by sealing the OLED with the metal foil.

Moreover, the embodiments of the present invention can prevent the OLED panel from being bent due to the heat during the manufacturing process by sealing the OLED with the metal foil having the same thermal expansion coefficient as or similar to that of the glass substrate.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device comprising:
a glass substrate;
an organic light emitting diode (OLED) formed on the glass substrate;
an adhesive layer formed to cover the OLED; and
a metal foil formed on the adhesive layer to seal the OLED, and bonded to the glass substrate,
wherein the metal foil is formed of an alloy having the same or substantially the same thermal expansion coefficient as that of the glass substrate, and
wherein the metal foil is formed of an alloy in which a content of Ni added to Fe has a composition ratio of approximately 33%~35% or approximately 38.5%~41.5%.

2. The organic light emitting device of claim 1, wherein the metal foil is formed of a Fe—Ni alloy or KOVAR (Fe—Ni—Co alloy).

3. The organic light emitting device of claim 2, wherein the Fe—Ni alloy includes Fe-36Ni or Fe-42Ni and the KOVAR includes Fe-33Ni-4.5Co.

4. The organic light emitting device of claim 1, wherein the metal foil has a thermal expansion coefficient of approximately 2.5 [ppm/° C.]~5.5 [ppm/° C.].

5. The organic light emitting device of claim 1, wherein the metal foil has a thickness of approximately 50 μm to 500 μm.

6. The organic light emitting device of claim 1, wherein the adhesive layer is formed of an adhesive film, an optical cleared adhesive (OCA), a thermal hardening resin, or a thermal hardening sealing material, to seal the OLED.

7. A method of forming an organic light emitting device, comprising:
forming a glass substrate;
forming an organic light emitting diode (OLED) on the glass substrate;
forming an adhesive layer to cover the OLED; and
forming a metal foil on the adhesive layer to seal the OLED, the metal foil bonded to the glass substrate, wherein the metal foil is formed of an alloy having the same or substantially the same thermal expansion coefficient as that of the glass substrate, and wherein the metal foil is formed of an alloy in which a content of Ni added to Fe has a composition ration of approximately 33%~35% or approximately 38.5%~41.5%.

8. The method of claim 7, wherein the metal foil is formed of a Fe—Ni alloy or KOVAR (Fe—Ni—Co alloy).

9. The method of claim 7, wherein the metal foil has a thermal expansion coefficient of approximately 2.5 [ppm/° C.]~5.5 [ppm/° C.].

10. The method of claim 7, wherein the metal foil has a thickness of approximately 50 μm to 500 μm.

11. The method of claim 7, wherein the adhesive layer is formed of an adhesive film, an optical cleared adhesive (OCA), a thermal hardening resin, or a thermal hardening sealing material, to seal the OLED.

12. A method for manufacturing an organic light emitting device, the method comprising:

providing a glass substrate;

forming an organic light emitting diode (OLED) and a plurality of lines and driving devices for driving the OLED on the glass substrate;

depositing a thermal hardening resin or a thermal hardening sealing material on the glass substrate to cover the OLED; and providing an adhesive layer by aligning a metal foil on the glass substrate and performing a thermal hardening process at a temperature of 80° C.~120° C. and sealing the OLED by bonding the glass substrate to the metal foil, wherein the metal foil is formed of an alloy having substantially the same thermal expansion coefficient as that of the glass substrate, and wherein the metal foil is formed of an alloy in which a content of Ni added to Fe has a composition ratio of approximately 33%~35% or approximately 38.5%~41.5%.

13. The method of claim 12, wherein the metal foil is formed of a Fe—Ni alloy or KOVAR (Fe—Ni—Co alloy).

14. The method of claim 12, wherein the Fe—Ni alloy includes Fe-36Ni or Fe-42Ni and the KOVAR includes Fe-33Ni-4.5Co.

15. The method of claim 12, wherein the metal foil is formed of an alloy having a thermal expansion coefficient of approximately 2.5 [ppm/° C.]~5.5 [ppm/° C.] to have a thickness of approximately 50 μm to 500 μm.

16. The method of claim 12, wherein the adhesive layer is formed of an adhesive film, an optical cleared adhesive (OCA), a thermal hardening resin, or a thermal hardening sealing material, to seal the OLED.

17. The method of claim 12, wherein the step of forming the OLED includes:

forming sequentially an anode electrode, a hole injection layer, a light emitting layer, an electron injection layer and a cathode electrode on the glass substrate.

* * * * *